United States Patent [19]
Yamada

[11] Patent Number: 4,592,078
[45] Date of Patent: May 27, 1986

[54] UP/DOWN COUNTER CONTROL CIRCUIT

[75] Inventor: Takaaki Yamada, Zama, Japan

[73] Assignee: Sony Corporation, Tokyo, Japan

[21] Appl. No.: 557,179

[22] PCT Filed: Mar. 28, 1983

[86] PCT No.: PCT/JP83/00093
§ 371 Date: Nov. 29, 1983
§ 102(e) Date: Nov. 29, 1983

[87] PCT Pub. No.: WO83/03502
PCT Pub. Date: Oct. 13, 1983

[30] Foreign Application Priority Data

Apr. 1, 1982 [JP] Japan ................................. 57-54465

[51] Int. Cl.⁴ .............................................. G06M 3/00
[52] U.S. Cl. ......................................... 377/52; 377/45; 377/54
[58] Field of Search ................... 377/52, 54, 55, 56, 377/45; 328/129.1

[56] References Cited
U.S. PATENT DOCUMENTS
3,701,106 10/1972 Loshbough ............................ 377/52

Primary Examiner—Stanley D. Miller
Assistant Examiner—K. Ohralik
Attorney, Agent, or Firm—Hill, Van Santen, Steadman & Simpson

[57] ABSTRACT

When the frequency dividing ratio of a programmable divider in a phase locked loop is controlled by an up/down counter, the designing of a system can be simplified by reducing the number of control lines connected to a microprocessor as much as possible. An up/down counter control circuit of the present invention comprises a timing control means to which a latch signal, a data and a clock signal are supplied, a data memory means and an up/down counter and is characterized in that under the control of the timing control means, in the data latch mode, a first level (0 or 1) of the latch signal is detected and in synchronism with the clock signal that data is latched in the data memory means, while in the up/down mode, a second level (1 or 0) of the latch signal is detected and the content of the up/down counter is changed in response to the level of the data synchronized with the clock signal.

8 Claims, 34 Drawing Figures

| INPUT | | | | OUTPUT | | MODE |
|---|---|---|---|---|---|---|
| $T_1$ | $T_2$ | A | B | AO | BO | |
| 0 | 0 | | | A | B | NORMAL |
| 1 | 0 | | | UNLOCK | B | UNLOCK |
| 1 | 1 | 0 | 0 | RD | PD | PC TEST |
| 1 | 1 | 1 | 0 | RD | RMB | RD TEST |
| 1 | 1 | 0 | 1 | PD | PMB | PD TEST |
| 1 | 1 | 1 | 1 | LDT | PSO | PS TEST AND TIMING |

FIG. 13

UP/DOWN COUNTER CONTROL CIRCUIT

DESCRIPTION

1. Technical Field

The present invention relates to an up/down counter control circuit suitable for use with a phase locked loop synthesizer receiver.

1. Background Art

In the art, an up/down counter has been used to vary the frequency dividing ratio of a programmable divider used in a phase locked loop.

Figure 1:
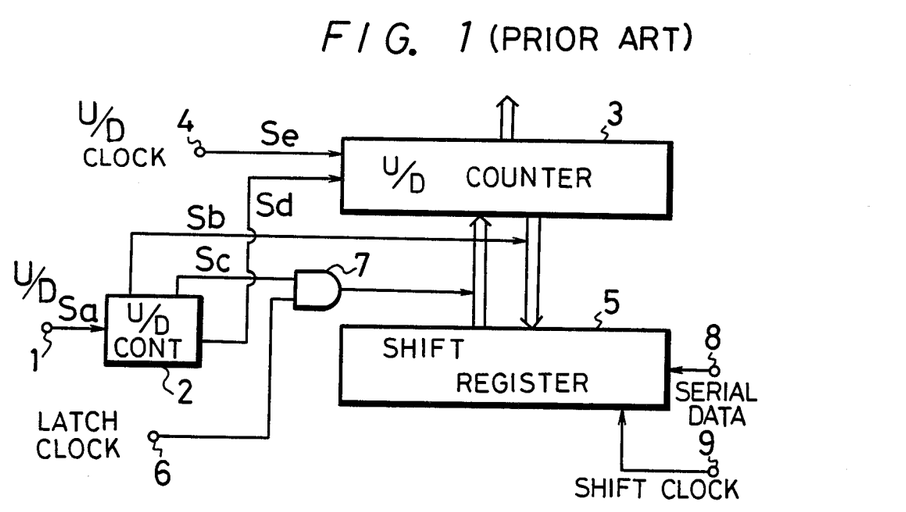
FIG. 1 is a systematic diagram showing an example of a conventional circuit.

As a control circuit for the up/down counter of such kind, there is proposed the circuit, for example, shown in FIG. 1. In FIG. 1, reference numeral 1 designates an input terminal to which an up/down counter control signal is supplied, 2 an up/down counter controller, 3 an up/down counter, 4 an input terminal to which an up/down clock signal is supplied, 5 a shift register, 6 an input terminal to which a latch clock signal is supplied, 7 an AND gate circuit, 8 an input terminal to which a serial data signal is supplied, and 9 an input terminal to which a shift clock signal is supplied.

Figure 2A:
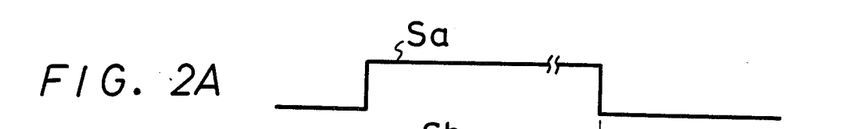
FIG. 2 is a diagram useful for explaining the operation of FIG. 1.
Figure 2B:
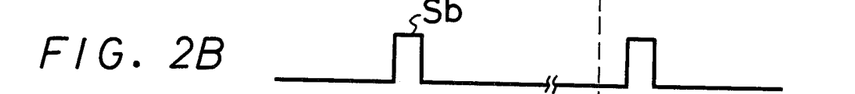
Figure 2C:
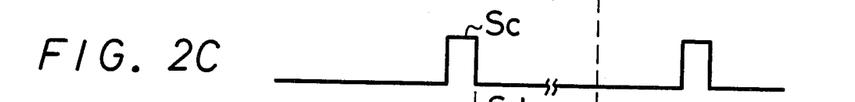
Figure 2D:
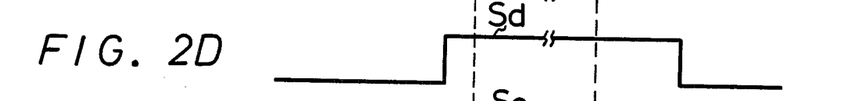
Figure 2E:
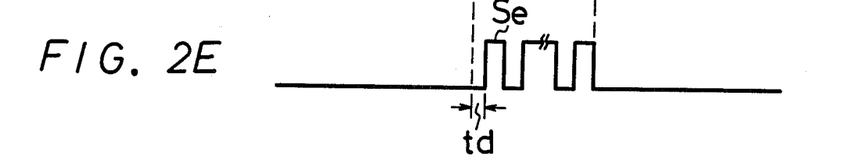

In the normal mode, the serial data from the input terminal 8 is inputted to the shift register 5 in synchronism with the clock signal supplied from the input terminal 9. The serial data is also latched in the up/down counter 3 in response to the clock signal from the input terminal 6. In the up/down mode, when an up/down signal Sa to be supplied to the input terminal 1 changes from "0" to "1" as shown in FIG. 2A, the content in the up/down counter 3 is transferred to the shift register 5 when a signal Sb from the up/down controller 2 shown in FIG. 2B occurs. Also, at the same time when the up/down counter 3 is set to the up mode in response to a signal Sd, which is shown in FIG. 2D, supplied from the up/down controller 2, the AND gate circuit 7 is opened in response to a signal Sc, which is shown in FIG. 2C, supplied from the up/down controller 2 so that in response to the output from the AND circuit 7 the content in the shift register 5 is returned to the up/down counter 3. After that subsequently, an up/down clock signal Se, which is shown in FIG. 2E, is supplied from the input terminal 4 to the up/down counter 3 and hence the content thereof is changed to the UP direction.

In the case of the conventional circuit shown in FIG. 1, in order to transfer the serial data from a control circuit (not shown) such as a microprocessor and the like to the shift register 5, it is necessary to transfer the serial data signal, the shift clock signal and the latch clock signal. Furthermore, as the signals for controlling the above up/down counter 3, the up/down clock signal and the up/down control signal must be transferred, which requires a large number of control lines.

DISCLOSURE OF INVENTION

Accordingly, it is a first object of the present invention to provide an up/down counter control circuit which can obviate the above defects.

It is another object of the present invention to provide an up/down counter control circuit which can reduce the number of control lines as much as possible.

According to an embodiment of the present invention, there is provided an up/down counter control circuit having a timing control means to which a latch signal, a data and a clock signal are supplied, a data memory means and an up/down counter wherein on the basis of the control by the timing control means, in the data latch mode, the first level (0 or 1) of the latch signal is detected and in synchronism with the latch signal the above data is latched in the data memory means, while in the up/down mode, the second level (1 or 0) of the latch signal is detected and the content of the up/down counter is changed in response to the level of the above data synchronized with the clock signal.

Figure 3:
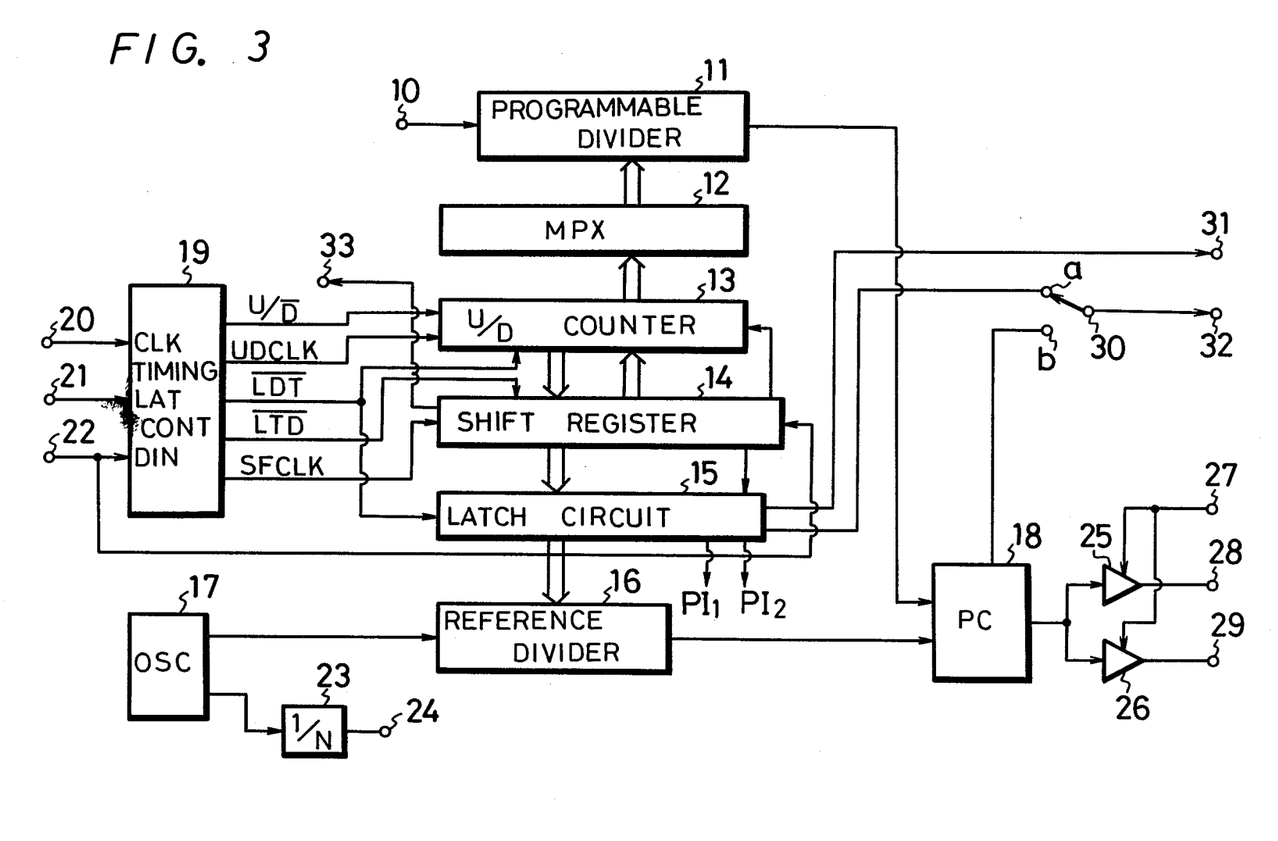
FIG. 3 is a systematic diagram showing an embodiment of the present invention.

Reference numeral 11 designates a programmable frequency divider, 13 an up/down counter, 14 a shift register, 15 a latch circuit, 16 a reference frequency divider and 19 a timing controller.

An embodiment of the present invention will hereinafter be described in detail with reference to FIGS. 3 to 13 for the case where the present invention is applied by way of example to a phase locked loop (PLL) used in a channel selection section of a synthesizer receiver.

FIG. 3 shows an overall arrangement of this embodiment. In the figure, reference numeral 10 designates an input terminal to which a frequency-divided output provided by frequency-dividing an output from a voltage controlled oscillator in the PLL circuit by a prescaler is supplied. Reference numeral 11 designates a programmable frequency divider formed by an 18-bit counter in the case of, for example, an FM/TV input and a 16-bit counter in the case of an AM input. Reference numeral 12 designates a multiplexer, 13 an 18-bit up/down counter, 14 a 20-bit shift register, 15 a 19-bit latch circuit, 16 a reference frequency divider formed of 14 bits, 17 a reference oscillator which has a frequency of 4.5 MHz as, for example, as a standard and is capable of covering 100 kHz to 10 MHz, 18 is a phase comparator for comparing the phases of the output signals from the frequency dividers 11 and 16 with each other and 19 is a timing controller which generates various timing signals. This timing controller 19 includes a CLK terminal (20-bit serial data input clock input terminal serving also as data up/down clock input terminal), an LAT terminal (shift register input data latch signal input terminal serving also as up/down mode selecting terminal) and a DIN terminal (data input terminal serving also as up/down terminal). These terminals are supplied with the corresponding control signals through control signal input terminals 20, 21 and 22 from a microcomputer (not shown).

Reference numeral 23 designates a 1/N frequency divider having an N value selected as, for example, 12 which then generates a system clock at its output terminal 24. Reference numerals 25 and 26 designate tri-state buffers which operate such that when a control signal to be applied to a control signal input terminal 27 is "1", they are in the normal operation mode and deliver the output from the phase comparator 18 to two independent and equivalent output terminals 28 and 29, while when the above control signal is "0", they function to make the output terminals 28 and 29 have high impedances. Thus, various applications such as a combination with an analog AFC, an intermittent tuning and so on become possible. The values of the bit processing in the above various circuits can arbitrarily be changed in accordance with the bit number of the data to be processed.

Figure 4:
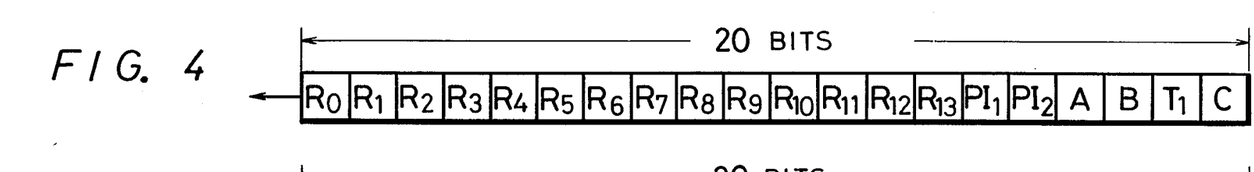
FIGS. 4 to 7 are diagrams useful for explaining the operation of FIG. 3.
Figure 5:
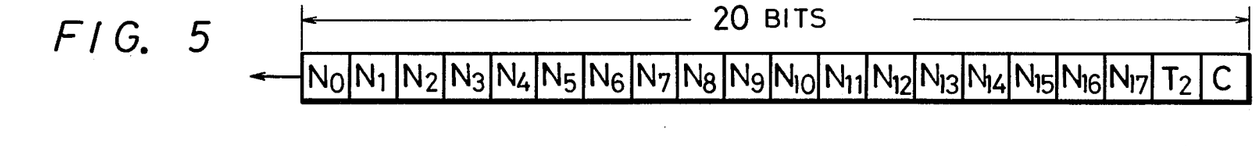

The above embodiment of the invention employs binary codes of 20 bits as shown in FIGS. 4 and 5. FIG. 4 shows a control input data to the reference frequency divider 16 and the like. This data is initial state setting data which must be inputted without fail when power is on or upon band switching, etc.

In FIG. 4, $R_0$ to $R_{13}$ represent binary values with $R_0$ taken as LSB. The above mentioned 14 bits represent the value of the frequency division which is supplied to the reference frequency divider 16. $PI_1$ and $PI_2$ are used to specify the signal input terminals. The programmable frequency divider 11 is provided at its input side with three independent AM, FM and TV input terminals which are not shown. These terminals are specified by the combination of 2 bits of $PI_1$ and $PI_2$. When $PI_1$ and $PI_2$ are, for example, (1, and 0), the AM signal input terminal is specified, when they are (0, and 1), the FM signal input terminal is specified and when they are (1, and 1), the TV signal input terminal is specified. A and B in FIG. 4 designate bits for pre-scaler controlling and an unlock signal outputting. When $T_1$ is "0", a movable contact of a switch 30 is connected to its contact a side to allow the values A and B to be delivered to terminals 31 and 32, respectively. These signals can be utilized for various purposes such as switching the frequency-dividing ratio of the pre-scaler in the PLL circuit, switching the constant of a low-pass filter not shown, a band switching signal and so on. The frequency-dividing ratio of the pre-scaler is switched by the combination of A and B of 2 bits. When A and B are, for example, (0, and 1), it is switched to 1/1, when (1, and 0), it is switched to ½, when (0, and 1), it is switched to ¼ and when (1, and 1), it is switched to ⅛. Moreover, when $T_1$ is "1", the switch 30 is changed in position to its contact b to permit a signal indicative of lock/unlock state of the phase comparator 18 to be delivered to the terminal 32. When the signal at the terminal 32 is, for example, "1", the unlock state is presented, while when it is "0", the lock state is presented. Accordingly, this signal can be used as a muting signal. On the other hand, when $T_1$ is "0", the data of A and B appear at the terminal 31. Reference letter C in FIG. 4 designates a code which determines the latch direction of the input data. When C is, for example, "0", the input data is latched in the reference frequency divider 16, while when it is "1", the input data is latched in the programmable frequency divider 11. When the control input data of the reference frequency divider 16 is handled, it is "0".

On the other hand, FIG. 5 shows data which determines the frequency dividing ratio of the programmable frequency divider 11. In FIG. 5, $N_0$ to $N_{17}$ are binary values with $N_0$ taken as LSB. The above 18 bits are used to present the value of the frequency dividing number which is supplied to the programmable frequency divider 11. The practical frequency-dividing number is made different depending on the signal input terminal selected by the combination of the above $PI_1$ and $PI_2$. When, for example, the AM, FM and TV signal input terminals are respectively selected, the ranges of the frequency-dividing number are from 4 to 65,537, 16 to 262,151 and 32 to 524,302, respectively. $T_2$ in FIG. 5 is used to select the test mode and is always "0" in the normal operation state in which the test is not carried out. Letter C in FIG. 5 designates a code which determines the latch direction of the input data in a manner which is similar as described above. In this case, it is made to be "1".

A method of inputting the control signal will be described next. In the present embodiment, there are two modes of the data latch mode (ordinary mode) and the up/down mode which are a little different from each other in the signal input method.

Figures 6A, 6B:
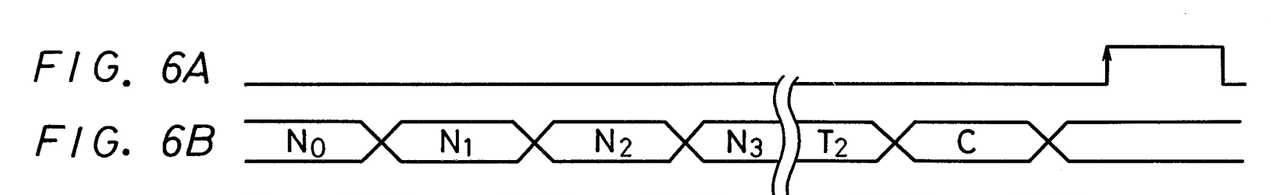
Figure 6C:
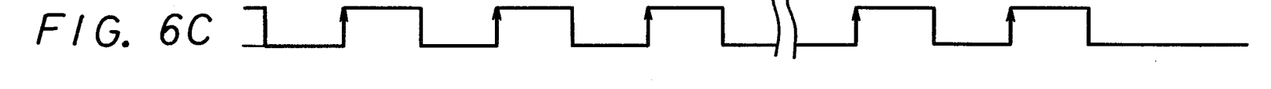

That is, the data latch mode is selected when the LAT terminal of the timing controller 19 is set in the "0" state as shown in FIG. 6A by the command from the microcomputer. Then, the data, as shown in FIG. 6B, which is supplied to the DIN terminal of the timing controller 19 from the microcomputer is latched bit by bit in the 20-bit shift register 14 at the leading edge of a clock shown in FIG. 6C, which is applied to the CLK terminal of the timing controller 19 from the microcomputer. After the data is sent to the shift register 14, if the LAT terminal of the controller 19 is set to "1" state, the data is latched. At that time, depending on the state of the final bit of the data, which is, the state of C in FIGS. 4 and 5, the input data is latched in either the programmable frequency divider 11 or the reference frequency divider 16. Namely, if the C is "1", it is the input data for the programmable frequency divider 11 so that the data thus latched is taken in the programmable frequency divider 11, while if the C is "0", it is the control input data for the reference frequency divider 16 and so on so that the data thus latched is taken in the reference frequency divider 16.

In practical use, when in response to the command from the microcomputer the signal of 20 bits as shown in FIG. 4, which is the control input data for the reference frequency divider 16 and the like, is first generated from the controller 19 and then latched and then the signal of 20 bits as shown in FIG. 5, which is the data for setting the programmable frequency divider 11 is delivered, the whole inside state is set. In the initial setting of the device, it is necessary to input 40 bits in a total of two steps. However, when the receiving frequency is changed within the same band, it is sufficient that only the data of 20 bits is changed.

Figure 7A:
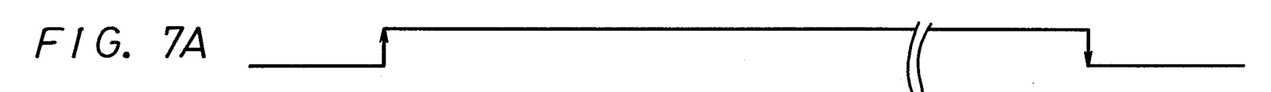
Figure 7B:
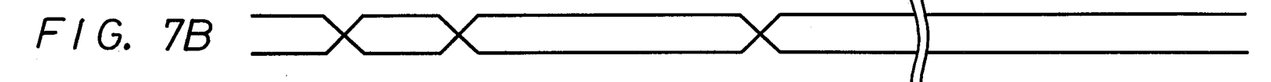
Figure 7C:
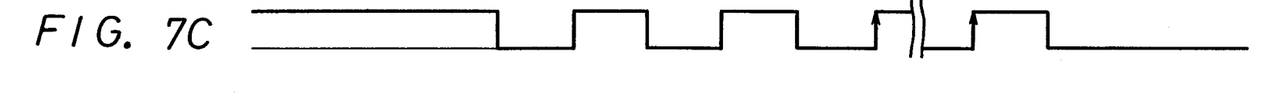

Next, when the LAT terminal of the controller 19 is made to be at "1" as shown in FIG. 7A, the mode becomes the up/down counter. In this mode, the frequency dividing number of the programmable frequency divider can be increased or decreased by the use of a data latch terminal 33. In other words, when the LAT terminal of the controller 19 becomes "1", the data is latched from the shift register 14 and at the same time the mode is changed to the up/down mode so that in response to "1" and "0" of the data, which is shown in FIG. 7B and supplied to the DIN terminal of the controller 19 from the microcomputer, the content of the up/down counter 13 is increased or decreased one by one at the leading edge of a clock (FIG. 7C) at the CLK terminal of the controller 19.

When the LAT terminal of the controller 19 becomes "0", the mode is returned to the normal mode and at the same time the content of the up/down counter 13 is, on the contrary, loaded into the shift register 14. The content of the shift register 14 thus loaded can be derived from the terminal 33 by inputting the clock to the CLK terminal of the controller 19, from which the present frequency divided number of the programmable frequency divider 11 can be known. The content of the shift register 14 is delivered from the terminal 33 successively, so that if the above successive output is returned to the controller 19, it is possible to confirm the transmitted data from the controller 19.

Figure 8:
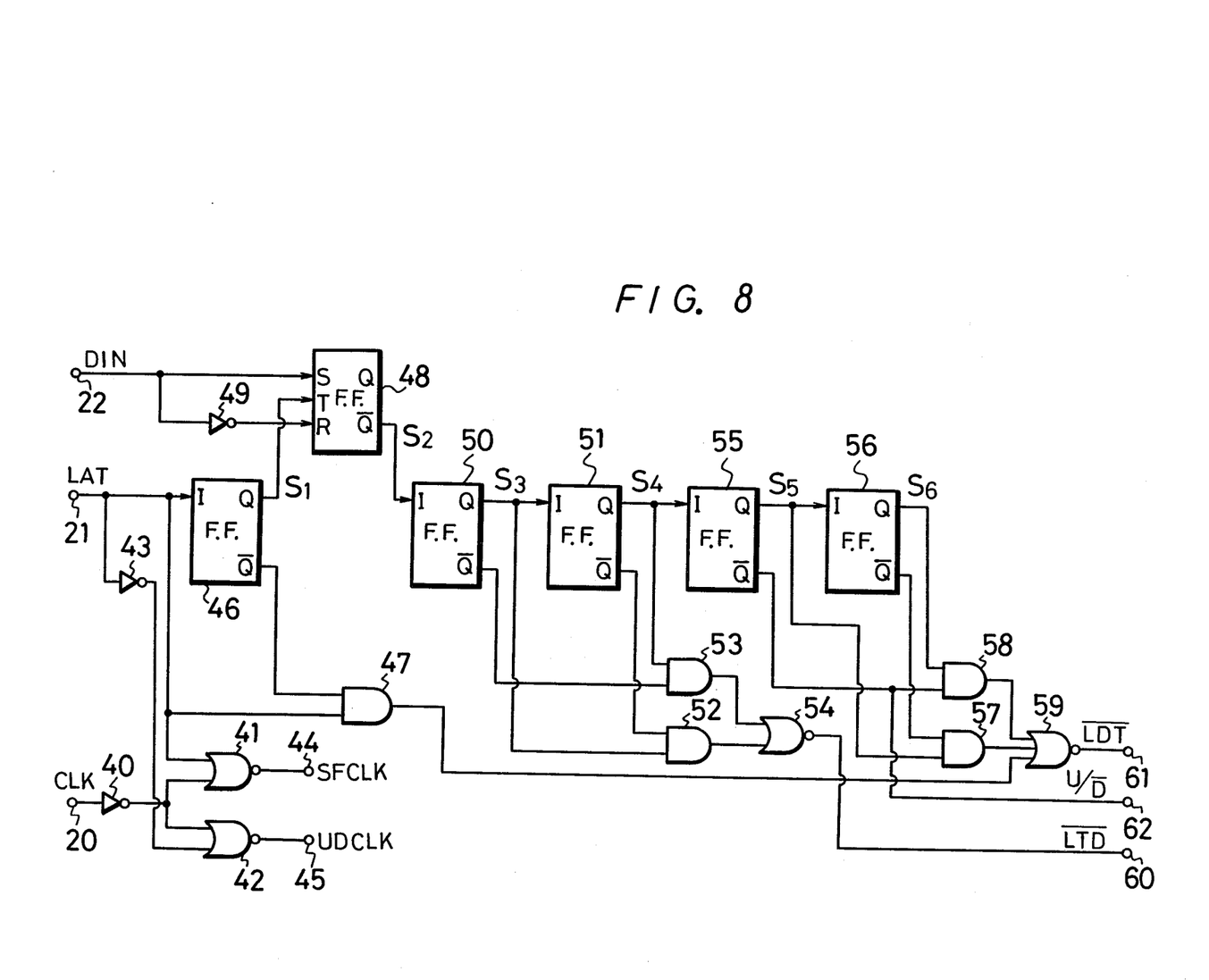
FIG. 8 is a circuit diagram showing an example of a main part of the present invention.
Figure 9:
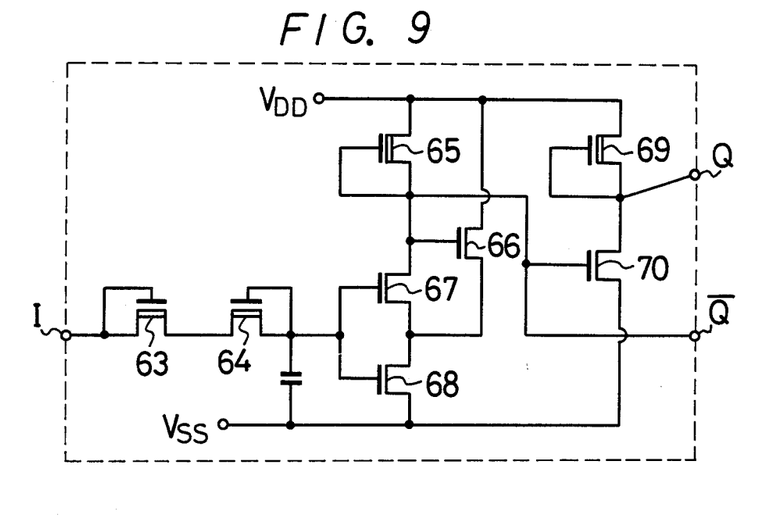
FIG. 9 is a connection diagram showing an example of a practical circuitry of the main part in FIG. 8.

FIG. 8 shows an example of a practical circuitry of the timing controller 19. In FIG. 8, the control signal input terminal 20 is connected through an inverter 40 to one of the input terminals of NOR circuits 41 and 42, while the control signal input terminal 21 is connected to the other input terminal of the NOR circuit 41 and also connected through an inverter 43 to the other input terminal of the NOR circuit 42. From the output terminals of the NOR circuits 41 and 42 are connected output terminals 44 and 45 which are respectively connected to the shift register 14 and the up/down counter 13 (both of which are shown in FIG. 3). The control signal input terminal 21 is connected to a delay circuit, for example, an input terminal I of a flip-flop circuit 46 and also to one input terminal of an AND circuit 47. An output terminal Q of the flip-flop circuit 46 is connected to a trigger terminal T of a flip-flop circuit 48, while an inverting output terminal $\overline{Q}$ thereof is connected to the other input terminal of the AND circuit 47.

The control signal input terminal 22 is connected to a set terminal S of the flip-flop circuit 48 and also is connected through an inverter 49 to a reset terminal R of the flip-flop circuit 48. An inverting output terminal $\overline{Q}$ of the flip-flop circuit 48 is connected to a delay circuit, for example, an input terminal I of a flip-flop circuit 50, while an output terminal Q of the flip-flop circuit 50 is connected to a delay circuit, for example, an input terminal I of a flip-flop circuit 51. The output terminal Q of the flip-flop circuit 50 and an inverting output terminal $\overline{Q}$ of the flip-flop circuit 51 are connected to respective input terminals of an AND circuit 52, while an inverting output terminal $\overline{Q}$ of the flip-flop circuit 50 and an output terminal $\overline{Q}$ of the flip-flop circuit 51 are connected to respective input terminals of an AND circuit 53. The output terminals of the AND circuits 52 and 53 are connected to respective input terminals of a NOR circuit 54.

The output terminal Q of the flip-flop circuit 51 is connected to a delay circuit, for example, an input terminal I of a flip-flop circuit 55, while an output terminal Q of the flip-flop circuit 55 is connected to a delay circuit, for example, an input terminal I of a flip-flop circuit 56. The output terminal Q of the flip-flop circuit 55 and an inverting output terminal $\overline{Q}$ of the flip-flop circuit 56 are connected to respective input terminals of an AND circuit 57, while the inverting output terminal $\overline{Q}$ of the flip-flop circuit 55 and an output terminal Q of the flip-flop circuit 56 are connected to respective input terminals of an AND circuit 58. The respective output terminals of the AND circuits 57 and 58 and the output terminal of the AND circuit 47 are connected to respective input terminals of a NOR circuit 59. From the output terminal of the NOR circuit 54 is led out an output terminal 60 which is connected to the shift register 14 (FIG. 3), while from the output terminal of the NOR circuit 59 is led out an output terminal 61 which is connected to the up/down counter 13 and the latch circuit 15 (both of which are shown in FIG. 3). Moreover, from the inverting output terminal $\overline{Q}$ of the flip-flop circuit 55 is led out an output terminal 62 which is connected to the up/down counter 13. Each of the flip-flop circuits 46, 50, 51, 55 and 56 used as the delay circuit consists of, as for example, shown in FIG. 9, FETs 63 and 64 composing a delay section, FETs 65 to 68 composing a hysteresis section and FETs 69 and 70 composing a buffer section.

The operation of the circuit shown in FIG. 8 will be described with reference to FIG. 10.

Figure 10A:
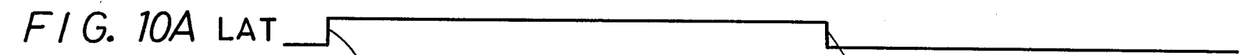
FIG. 10 is a diagram useful for explaining the operation of FIG. 8.
Figure 10B:
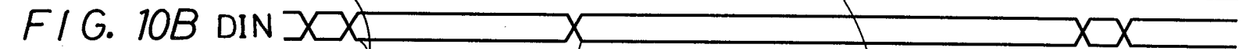
Figure 10C:
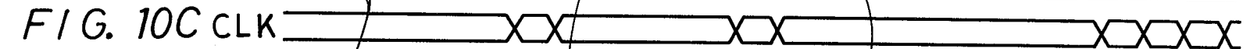

When a signal LAT shown in FIG. 10A, which is supplied to the control signal input terminal 21, changes from "0" to "1", the circuit operation changes from the ordinary mode (data latch mode) to the up/down mode. When the signal LAT changes from "0" to "1", the gates of the AND circuit 47 and the NOR circuit 59 are both opened to allow a load signal $\overline{LDT}$ shown in FIG. 10J to be delivered to the output terminal 61 by which the content of the shift resister 14 (FIG. 3) is latched in the up/down counter 13 (FIG. 3). Also in the ordinary mode, a shift clock signal SFCLK for the shift register 14, which is derived through the NOR circuit 41 to the output terminal 44 in response to a clock signal CLK shown in FIG. 10C, which is supplied from the control signal input terminal 20 is interrupted as shown in FIG. 10M since the gate of the NOR circuit 41 is closed by the change of the signal LAT from "0" to "1". On the other hand, an up/down clock signal UDCLK shown in FIG. 10N, which is not yet delivered in the ordinary mode, for the up/down counter 13 is delivered to the output terminal 45 since the gate of the NOR circuit 42 is opened by the change of the signal LAT from "0" to "1".

Figure 10D:
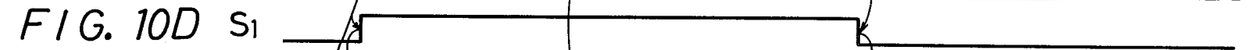
Figure 10E:
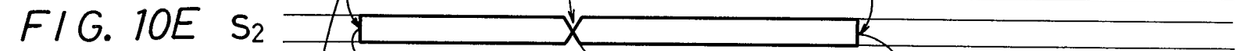
Figure 10F:
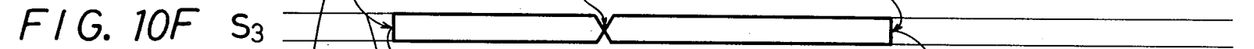
Figure 10G:
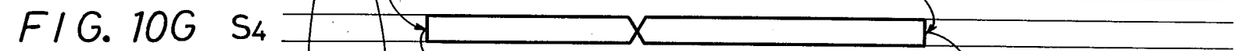
Figure 10H:
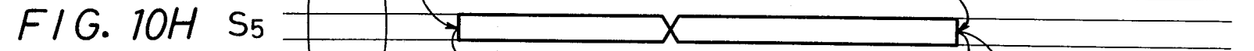
Figure 10I:
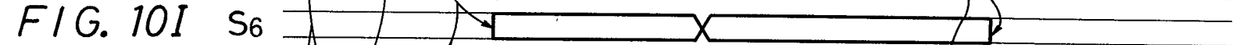
Figure 10J:
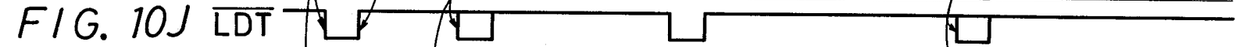
Figure 10K:
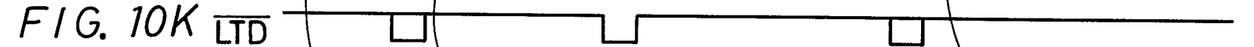
Figure 10L:
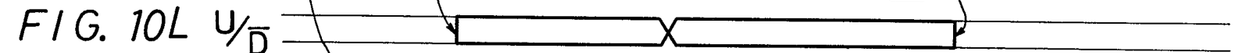
Figure 10M:
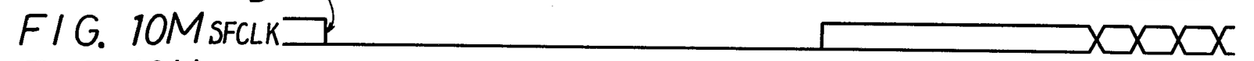
Figure 10N:
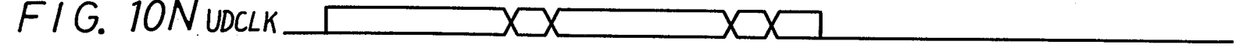

In synchronism with the change of the signal LAT from "0" to "1", at the output terminal Q of the flip-flop circuit 46 is generated an output signal $S_1$ as shown in FIG. 10D after a predetermined delay time, which is then supplied to the trigger terminal T of the flip-flop circuit 48. This flip-flop circuit 48 delivers its input signal when the level of the trigger terminal T is, for example, "1", while when it is "0", the flip-flop circuit holds the preceding state. Accordingly, when the level of the trigger terminal T is changed from "0" to "1" by the signal $S_1$ applied thereto, a signal DIN supplied from the control signal input terminal 22 and shown in FIG. 10B is directly delivered to the inverting output terminal $\overline{Q}$ of the flip-flop-circuit 48 as an output signal $S_2$ as shown in FIG. 10E. This signal $S_2$ is sequentially transmitted with a predetermined delay time to the flip-flop circuits 50, 51, 55 and 56 at the later stages so that at the output terminals Q of the respective flip-flop circuits 50, 51, 55 and 56 appear output signals $S_3$, $S_4$, $S_5$ and $S_6$ as shown in FIGS. 10F to 10I. During only the period in which the levels of the signals $S_3$ and $S_4$ are different from each other, the gate of the NOR circuit 54 is opened by way of the AND circuits 52 and 53 to permit a load signal $\overline{LTD}$ as shown in FIG. 10K to be delivered to the output terminal 60 by which the content of the up/down counter 13 is temporarily transferred to the shift register 14. When the signal $S_5$ changes from "0" to "1", at the output terminal 62 appears an up/down signal $U/\overline{D}$ occurs as shown in FIG. 10L and at the output terminal 61 appears a next load signal $\overline{LDT}$ as shown in FIG. 10J by which the content temporarily stored in the shift register 14 is returned to the up/down counter 13. The reason why before the generation of the up/down signal U/$\overline{D}$ the content of the up/down counter 13 is temporarily held in the shift register 14 and returned to the up/down counter 13 at the same time when the signal U/$\overline{D}$ is generated is due to the construction of the up/down counter and when the up/down counter is regularly constructed, if a data is latched in the up/down counter before the switching of the up/down modes, the data in the up/down counter is destroyed upon switching the up/down modes.

The content of the up/down counter 13, in the up/down mode, is decreased or increased one by one in response to the level of the signal DIN indicative of the up mode and down mode and is supplied from the input terminal 22 at the leading edge of the up/down clock signal UDCLK (FIG. 10N) from the output terminal 45. By way of example, when the level of the signal DIN is "1", the content of the up/down counter 13 is increased one by one at each leading edge of the clock signal UDCLK supplied thereto, while when the level thereof is "0", it is decreased one by one the leading edge of the clock signal UDCLK at every time when the latter is applied.

Subsequently, when the signal LAT changes from "1" to "0" as shown in FIG. 10A, the circuit operation is changed from the up/down mode to the normal mode, namely, the data latch mode. Then, in synchronism with the change of the signal LAT from "1" to "0, the signals $S_1$ to $S_6$ change from "1" to "0" with a predetermined delay time. Then, during the period in which the levels of the signals $S_3$ and $S_4$ are different from each other, at the output terminal 60 appears the load signal $\overline{LTD}$ by which the content of the up/down counter 13 is loaded to the shift register 14. The content of the shift register 14 thus loaded can be derived at the output terminal 33 (FIG. 3) by inputting to the shift register 14 the shift clock signal SFCLK (FIG. 10M) and the level is changed from "0" to "1" in synchronism with the change of the signal LAT from "1" to "0". Thus, it is possible to know the present frequency dividing number of the programmable frequency divider 11 (FIG. 3).

Further, in synchronism with the change of the signal $S_5$ from "1" to "0", the up/down signal U/$\overline{D}$ at the output terminal 62 changes from "1" to "0" as shown in FIG. 10L so as not to be synchronized with the signal DIN so that thereafter the signal U/$\overline{D}$ holds the level of the signal DIN at the time point when its level is changed. The same operation is carried out for the signals $S_2$ to $S_6$ and thus these signals, after they have changed from "1" to "0", hold the level of the signal DIN at the time when the level thereof is changed.

Furthermore, in synchronism with the change of the signal $S_5$ from "1" to "0", namely, at the same time when the generation of the signal U/$\overline{D}$ is stopped, at the output terminal 61 there appears the load signal $\overline{LDT}$ as shown in FIG. 10J by which the content of the shift register 14 is returned to the up/down counter 13.

Figure 11:
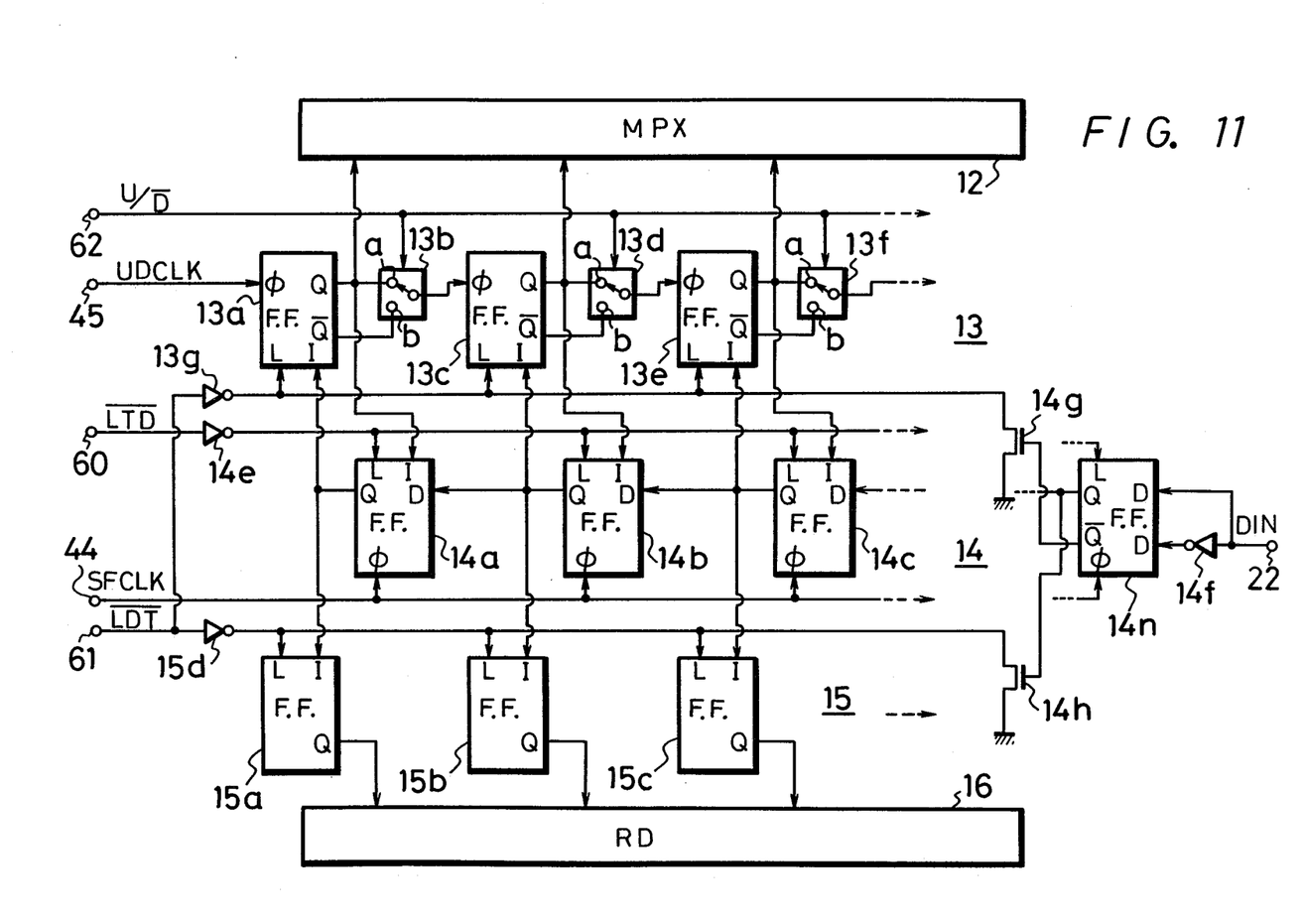
FIG. 11 is a circuit diagram showing an example of other main part of the present invention.

FIG. 11 shows an example of a practical circuitry of the up/down counter 13, the shift register 14 and the latch circuit 15. In the figure, the output terminal 45, from which the up/down clock signal UDCLK is delivered, is connected to a clock terminal $\phi$ of a flip-flop circuit 13a in the up/down counter 13. An output terminal Q and an inverting output terminal $\overline{Q}$ of the flip-flop circuit 13a are connected through a switching circuit 13b to a clock terminal $\phi$ of a flip-flop circuit 13C. An output terminal Q and an inverting output terminal $\overline{Q}$ of the flip-flop circuit 13C are connected through a switching circuit 13d to a clock terminal $\phi$ of a flip-flop circuit 13e. An output terminal Q and an inverting output terminal $\overline{Q}$ of the flip-flop circuit 13e are connected through a switching circuit 13f to a clock terminal of a flip-flop circuit at the succeeding stage not shown. These flip-flop circuits and switching circuits are provided in a number corresponding to the bit number of the up/down counter 13 which bit number depends on the bit processing. The switching circuits 13b, 13d, 13f . . . are changed in position in response to the up/down signal U/$\overline{D}$ from the output terminal 62. For example, in the down mode, the movable contacts of the switching circuits 13b, 13d, 13f . . . are connected to their contacts a, while in the up mode, they are changed in position to their contacts b.

The output terminal 61, from which the load signal $\overline{LDT}$ is derived, is connected through an inverter 13g to a load terminal L of each of the flip-flop circuits 13a, 13c and 13e . . . in the up/down counter 13 so that each of the flip-flop circuits 13a, 13c, 13e . . . is set in the load state to receive the input signal when the level of the load terminal L is a predetermined level, for example, "1".

The output terminal 44, from which the shift clock signal SFCLK is derived, is connected to clock terminals $\phi$ of flip-flop circuits 14a, 14b, 14c . . . 14n connected in cascade in the shift register 14. These flip-flop circuits are provided in a number corresponding to the bit number of the shift register 14 which bit number depends on its bit processing. The output terminal 60, from which the load signal $\overline{LTD}$ is derived, is connected through an inverter 14e to a load terminal L of each of the flip-flop circuits 14a, 14b, 14c . . . 14n. Thus, each of the flip-flop circuits 14a, 14b, 14c . . . 14n is set in the load state for the input data which is the serial data, namely, the data from the input terminal 22 when the level of the load terminal L becomes "0", while it is set in the load state for the input data which is the parallel data, namely, the data from the up/down counter 13 when the level of the load terminal L becomes "1". Further, the input terminal 22 to which the signal DIN is applied is connected to a data input terminal D of the flip-flop circuit 14n and also is connected through an inverter 14f to a data inverting input terminal $\overline{D}$ thereof.

The flip-flop circuit for the final bit of the data inputted to the shift register 14, namely, the flip-flop circuit 14n is provided at its output side with field-effect transistors 14g and 14h of a wired-OR construction, which check the level of the code C, which determines the latch direction of the input data in FIGS. 4 and 5, and then selectively supply the content of the shift register 14 to the up/down counter 13 on the latch circuit 15. That is, the gate terminal of the transistor 14g is connected to an inverting output terminal $\overline{Q}$ of the flip-flop circuit 14n, the drain terminal thereof is connected to the load terminal L of each of the flip-flop circuits 13a, 13c, 13e . . . in the up/down counter 13 and the source terminal thereof is grounded. The gate terminal of the transistor 14h is connected to an output terminal Q of the flip-flop circuit 14n, the drain terminal thereof is connected to a load terminal L of each of flip-flop circuits 15a, 15b, 15c . . . in the latch circuit 15 and the source terminal thereof is grounded. The flip-flop circuits composing the latch circuit 15 are provided in number corresponding to the bit number of the latch circuit 15 which bit number depends on its bit processing. To the load terminals L of the flip-flop circuits 15a, 15b, 15c . . . are connected through an inverter 15d the output terminal 61, from which the load signal $\overline{\text{LDT}}$ is derived. An output terminal Q of each of the flip-flop circuits 15a, 15b, 15c . . . are connected to the reference frequency-divider 16.

Output terminals Q of the remaining flip-flop circuits except the final bit flip-flop circuit 14n in the shift register 14, namely, the flip-flop circuits 14a, 14b, 14c . . . in FIG. 11 are respectively connected to input terminals I of the corresponding flip-flop circuits 13a, 13b, 13c . . . in the up/down counter 13 and are also connected to input terminals I of the corresponding flip-flop circuits 15a, 15b, 15c . . . in the latch circuit 15. An output terminal Q of each of the flip-flop circuits 13a, 13c, 13e . . . in the up/down counter 13 is connected through the multiplexer 12 to the programmable frequency divider 11 (FIG. 3) and are also connected to an input terminal I of each of the corresponding flip-flop circuits 14a, 14b, 14c . . . in the shift register 14.

In the normal mode (data latch mode) in which the signal LAT is "0", the data signal DIN from the input terminal 22 is supplied bit by bit to the respective flip-flop circuits 14a, 14b, 14c . . . 14n in the shift register 14 at the leading edge of the shift clock signal SFCLK from the output terminal 44. When the signal LAT becomes "1", the load signal $\overline{\text{LDT}}$ is generated from the output terminal 61 so that the respective flip-flop circuits of the up/down counter 13 and the latch circuit 15 are all set in the load state. However, depending on the state of the final bit of the input data, the load state of one side of the respective flip-flop circuits in the up/down counter 13 and the latch circuit 15 is restricted, and only the other side thereof is substantially set in the load state. Namely, when the last bit (the C code in FIGS. 4 and 5) of the data supplied to the input terminal 22 is "1", the transistor 14h is turned on and the level of the load terminal of each of the flip-flop circuits 15a, 15b, 15c . . . in the latch circuit 15 becomes "0" so that its load state is restricted, while since the transistor 14g is in the off state, only each of the flip-flop circuits 13a, 13c, 13e . . . in the up/down counter 13 is set in the load state. Thus, the content of the shift register 14 is latched in the up/down counter 13 and then used as the data for the programmable frequency divider 11. While, when the last bit of the input data supplied to the input terminal 22 is "0", the transistor 14g is turned on and the transistor 14h is turned off so that the load state of each of the flip-flop circuits 13a, 13c, 13e . . . in the up/down counter 13 is restricted. As a result, the content of the shift register 14 is latched in the latch circuit 15 and then used as the data for the reference frequency divider 16.

Then, when the signal LAT becomes "1", the mode is changed to the up/down mode and by the load signal $\overline{\text{LTD}}$ from the output terminal 60 each of the flip-flop circuits 14a, 14b, 14c, . . . 14n in the shift register 14 is set in the load state so that the content of the up/down counter 13 is temporarily transferred to the shift register 14. At the same time when the up/down signal U/$\overline{\text{D}}$ is generated from the output terminal 62, the load signal $\overline{\text{LDT}}$ is generated from the output terminal 61 so that the up/down counter 13 is again set in the load state, returning the content of the shift register 14 to the up/down counter 13. After that, the up/down clock signal UDCLK from the output terminal 45 is received so that when the signal U/$\overline{\text{D}}$ is b "0", the switching circuits 13b, 13d, 13f . . . are each changed in position to the contacts a and the down mode is presented. Thus, the content of the up/down counter 13 is decreased one by one at the leading edge of the up/down clock signal UDCLK. On the other hand, when the signal U/$\overline{\text{D}}$ is "1", the switching circuits 13b, 13d, 13f . . . are each changed in position to the contacts b so that the up mode is presented, thus increasing one by one the content of the up/down counter 13 at the leading edge of the up/down clock signal UDCLK.

Figure 12:
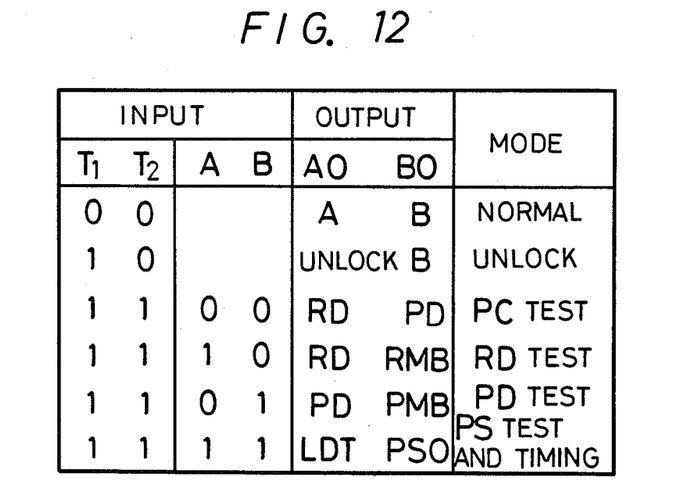
FIG. 12 is a diagram used to explain the present invention and FIG. 13 is a circuit diagram showing an example of further main part of the present invention.

FIG. 12 shows in detail an example of a relation mode between an output signal AO provided at the output terminal 32 (FIG. 3) and an output signal BO provided at the output terminal 31 (FIG. 3) by the combination of the bit codes A, B and $T_1$ for the pre-scaler controlling and the unlock signal outputting shown in FIG. 4 and the test bit code $T_2$ shown in FIG. 5. When ($T_1$, $T_2$) is, for example, (0, 0), the normal mode is presented and the values of A and B are respectively delivered to the output terminals 32 and 31 as they are, while when (1, 1), the unlock mode is presented under which the unlock state of the phase comparator 18 (FIG. 3) is produced at the output terminal 32 and the value of B is produced at the output terminal 31. When ($T_1$, $T_2$) and (A, B) are (1, 1) and (0, 0), at the output terminal 32 appears the output signal RD of the reference frequency divider 16 (FIG. 3) and at the output terminal 31 appears the output signal PD of the programmable frequency divider 16 (FIG. 3), respectively, thus the test mode of the phase comparator 18 (FIG. 3) is presented and the operation of the phase comparator 18 can be checked. When (1, 1) and (1, 0) there appear, at the output terminal 32 appears the output signal RD of the reference frequency divider 16 and at the output terminal 31 there appears at the least most significant bit RMB in the output signal from the reference frequency divider 16 so that the test mode of the reference frequency divider 16 is presented and the operation check of the reference frequency divider 16 becomes possible. When (1, 1) and (0, 1) appear, at the output terminal 32 there appears the output signal PD of the programmable frequency divider 16 and at the output terminal 31 there appears at least the most significant bit PMB in the output signal of the programmable frequency divider 11 respectively so that the test mode of the programmable frequency divider 11 occurs and the operation of the programmable frequency divider 11 can be checked. When (1, 1) and (1, 1) appear, the pre-scaler test and timing modes occur at the output terminal 32 and there the data load signal LDT occurs and at the output terminal 31 there appears the output signal PSD of the pre-scaler (not shown).

Figure 13:
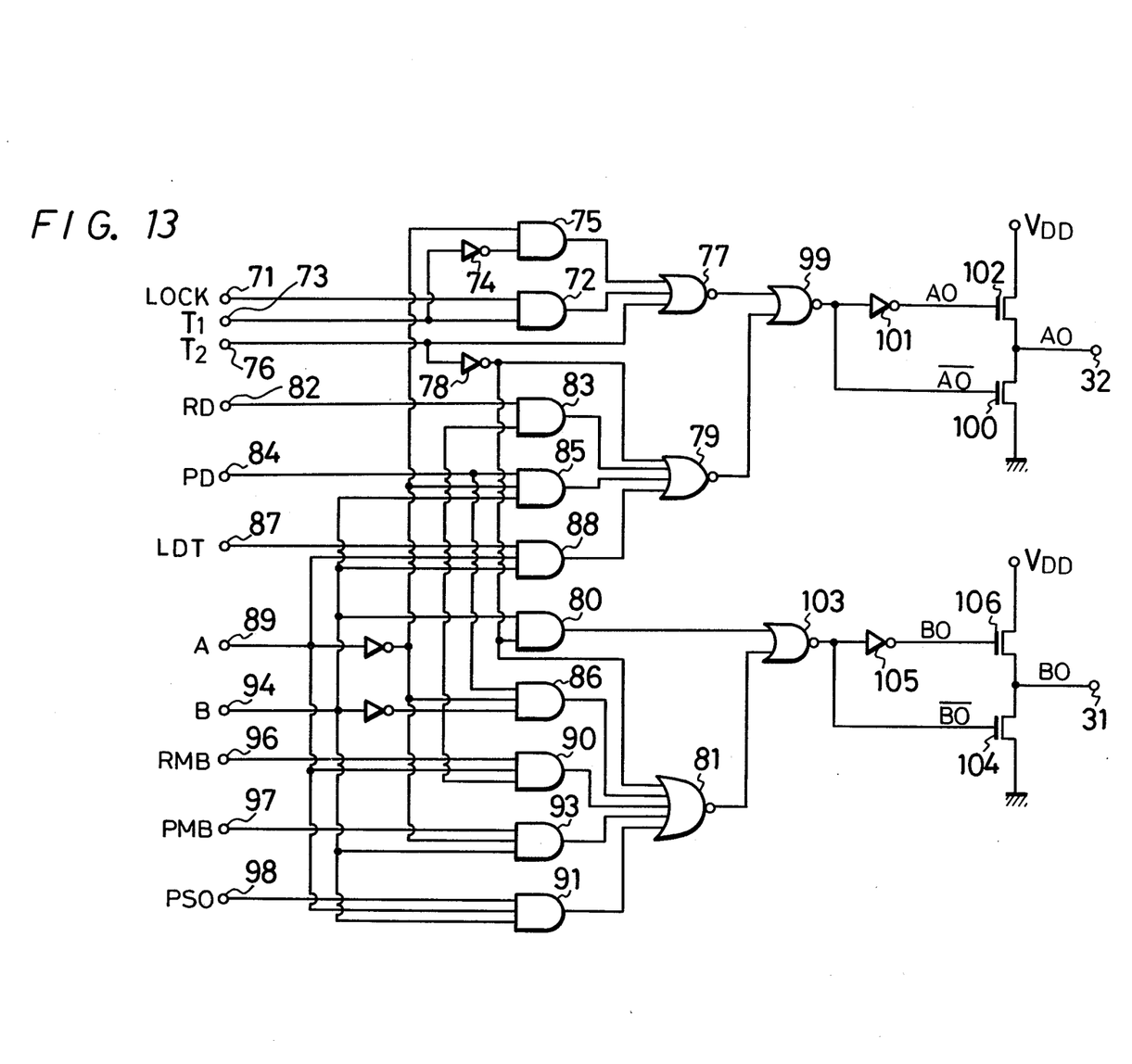

FIG. 13 shows an example of a practical circutry which carries out the above logical operations in FIG. 12. In practice, the output terminals 31 and 32 in FIG. 3 are led out through gate circuits as shown in FIG. 13. In FIG. 13, an input terminal 71 (which substantially corresponds to the contact b of the switch 30 in FIG. 3) to which the lock signal LOCK is supplied from the phase comparator 18 (FIG. 3) is connected to one input terminal of an AND circuit 72, while an input terminal 73 to which the bit $T_1$ is applied from the shift register 14 or the latch circuit 15 (each of which is shown in FIG. 3) is connected to the other input terminal of the AND circuit 72 and is also connected through an inverter 74 to one input terminal of an AND circuit 75. An input terminal 76 to which the bit $T_2$ is applied from the shift register 14 or the up/down counter 13 is connected to one input terminal of a NOR circuit 77 and is also connected through an inverter 78 to one input terminals of a NOR circuit 79, an AND circuit 80 and a NOR circuit 81.

An input terminal 82 to which the output signal RD of the reference frequency divider 16 (FIG. 3) is supplied is connected to one input terminal of an AND circuit 83, while an input terminal 84 to which the output signal PD of the programmable frequency divider 11 is supplied is connected to one input terminal of an AND circuit 85 and is also connected to one input terminal of an AND circuit 86. On the other hand, an input terminal 87 to which a signal LDT, which is provided by inverting the load signal $\overline{LDT}$ from the timing controller 19 (FIG. 3) is supplied is connected to one input terminal of an AND circuit 88. An input terminal 89 to which the bit A is supplied from the shift register 14 or the latch circuit 15 is connected to another input terminal of the AND circuit 88 and to first input terminals of AND circuits 90 and 91 and is further connected through an inverter 92 to other input terminals of the AND circuits 75, 85 and 86 and to one input terminal of an AND circuit 93. Similarly, an input terminal 94 to which the bit B is supplied from the shift register 14 or the latch circuit 15 is connected to the still other input terminals of the AND circuits 85 and to 88 and is other input terminals of the AND circuits 80, 93 and 91 and further connected through an inverter 95 to the still other input terminal of the AND circuit 86. An input terminal 96 to which the most significant bit RMB in the output signal of the reference frequency divider 16 is supplied is connected to the still other input terminal of the AND circuit 90. An input terminal 97 to which the most significant bit PMB in the output signal of the programmable frequency divider 11 is supplied is connected to the still other input terminal of the AND circuit 93. An input terminal 98 to which the output signal PSO of the pre-scaler (not shown) is supplied is connected to the still other input terminal of the AND circuit 91.

The respective output terminals of the AND circuits 75 and 72 are connected to the other input terminals of the NOR circuit 77. The respective output terminals of the AND circuits 83, 85 and 88 are connected to the other input terminals of the NOR circuit 79. The output terminals of the NOR circuits 77 and 79 are connected to respective input terminals of a NOR circuit 99. The output terminal of the NOR circuit 99 is connected to the gate terminal of a field-effect transistor 100 and is also connected through an inverter 101 to the gate terminal of a field-effect transistor 102. The source terminal of the transistor 100 is grounded and the drain terminal thereof is connected to the source terminal of the transistor 102, while the drain terminal of the transistor 102 is connected to a positive power source terminal $V_{DD}$ and the output terminal 32 is led out from the connection point between the drain terminal of the transistor 102 and the source terminal of the transistor 102.

The output terminals of the AND circuits 86, 90, 93 and 91 are connected to the respective input terminals of the NOR circuit 81, while the output terminals of the AND circuit 80 and the NOR circuit 81 are connected to the respective input terminals of a NOR circuit 103. Then, the output terminal of the NOR circuit 103 is connected to the gate terminal of a field-effect transistor 104 and is also connected through an inverter 105 to the gate terminal of a field-effect transistor 106. The source terminal of the transistor 104 is grounded and the drain terminal thereof is connected to the source terminal of the transistor 106. The drain terminal of the transistor 106 is connected to the positive power source terminal $V_{DD}$ and the output terminal 31 is led out from the connection point between the drain terminal of the transistor 104 and the source terminal of the transistor 106.

When the bit $T_1$ at the input terminal 73 and the bit $T_2$ at the input terminal 76 are both "0", the bit A at the input terminal 89 and the bit B at the input terminal 94 are respectively generated at the output terminals 32 and 31 so that by the combination of these bits the switching of the frequency dividing ratio of the external pre-scaler, the constant of the filter and so on can be carried out.

When the bit $T_1$ is "1" and the bit $T_2$ is "0", at the output terminal 32 there appears the unlock signal, namely, the signal provided by inverting the signal LOCK, while at the output terminal 31 appears the bit B. When the bits $T_1$ and $T_2$ are both "1" and the bits A and B are both "0", at the output terminals 32 and 31 appear the output signals RD and PD which are the output signals of the frequency dividers 16 and 11 from the input terminals 82 and 84. With these output signals, the operation of the phase comparator 18 is checked. When the bits $T_1$ and $T_2$ are both "1" and the bits A and B are respectively "1" and "0", the output signal RD of the reference frequency divider 16 from the input terminal 82 is generated at the output terminal 32 and the most significant bit RMB in the output signal of the reference frequency divider 16 from the input terminal 96 is generated at the output terminal 31 so as to check whether the data is accurately transmitted from the least significant bit to the most significant bit throughout the inside of the reference frequency divider 16. When the bits $T_1$ and $T_2$ are both "1" and the bits A and B are respectively "0" and "1", the output signal PD of the programmable frequency divider 11 from the input terminal 84 is generated at the output terminal 32 and the most significant bit PMB in the output signal of the programmable frequency divider 11 from the input terminal 97 is generated at the output terminal 31 thereby to check whether the data is accurately transmitted from the least significant bit to the most significant bit throughout the inside of the programmable frequency divider 11. Furthermore, when the bits $T_1$, $T_2$, A and B are all "1", the load signal LDT of the data from the input terminal 87 is generated at the output terminal 32 and is used as the timing signal, while the output signal PSO of the pre-scaler from the input terminal 98 is generated at the output terminal 31 and is used to check the operation of the pre-scaler.

As set forth above, according to the present invention, in the first mode, namely, the serial data transfer mode (normal mode), the first, second and third signals to be supplied to the timing control means, namely, the signals to be supplied to the LAT terminal, DIN terminal and CLK terminal of the timing controller 19 are respectively used as the latch signal for the input data to the memory means (shift register) and the clock signal for the serial data input signal and for inputting the serial data, while in the second mode, namely, the up-/down mode, the above first, second and third signals are respectively used as the up/down mode selecting signal and the clock signal for the up/down signal and up-/down of the serial data and the up/down counter control signal is processed also by the serial data transfer signal. Thus, although there are required three control lines for transferring the serial data and two control lines for controlling the up/down counter in the prior art, three control lines for transferring the serial data are substantially sufficient so that the system can be simplified.

In the above embodiment, the present invention is applied to the PLL circuit for the synthesizer receiver. It is needless to say that the present invention is not limited to the above circuit but can be applied to other circuits.

I claim:

1. An up/down counter control circuit for use with a phase-locked loop circuit comprising: a reference signal oscillator means providing a reference oscillating signal; a voltage controlled oscillator means having an output providing an output oscillating signal whose frequency depends on an error signal applied thereto; a programmable divider means connected to the output of said voltage controlled oscillator means for providing a divided signal, and having a programmable dividing ratio and having a control terminal for receiving a programming control signal for programming the dividing ratio thereof; a phase comparator means supplied with said reference oscillating signal and said divided signal and having an output producing said error signal in response to the phase difference therebetween; a data register means for providing said programming control signal from an output thereof; an up/down counter means coupled between the output of said data register means and the control terminal of said programmable divider means to receive the programming control signal therein so as to control the dividing ratio of said programmable divider means; a signal input means for receiving a latch signal, a data signal and a clock signal; and a timing control means connected to said signal input means, wherein under control of said timing control means, in a data latch mode, a first level (0 or 1) of said latch signal is detected and said data signal is latched in synchronism with said clock signal in said data register means, while in an up/down mode, a second level (1 or 0) of said latch signal is detected and the content of said up/down counter is changed in response to the level of said data signal in synchronism with said clock signal.

2. An up/down counter control circuit according to claim 1, wherein said data memory means latches the data by detecting the change of said latch signal from said first level (0 or 1) to said second level (1 or 0) by said timing control means.

3. An up/down counter control circuit according to claim 1, wherein said up/down counter stops to increase and/or decrease a count value by detecting the change of said latch signal from said second level (1 or 0) to said first level (0 or 1) by said timing control means and transfers said count value to said data memory means.

4. An up/down counter control circuit according to claim 1, wherein said up/down counter controls a frequency dividing ratio of a programmable counter in a phase locked loop.

5. An up/down counter control circuit according to claim 1, wherein said data to be transferred to said data memory means contains at least a data for setting the frequency dividing ratio of a programmable divider in said phase locked loop and a data for setting the frequency dividing ratio of said reference frequency divider.

6. An up/down counter control circuit according to claim 5, wherein a final bit of the data supplied to said data memory means is checked and then said data is transferred to said programmable divider in said phase locked loop or said reference frequency divider.

7. An up/down counter control circuit according to claim 3, wherein said data memory means is provided with an output terminal for generating the data transferred thereto from said up/down counter.

8. An up/down counter control circuit according to claim 1, wherein said data memory means is formed of a shift register.

* * * * *